(12) United States Patent
Tsuyutani et al.

(10) Patent No.: US 12,240,751 B2
(45) Date of Patent: Mar. 4, 2025

(54) SENSOR PACKAGE SUBSTRATE, SENSOR MODULE HAVING THE SAME, AND SENSOR PACKAGE SUBSTRATE MANUFACTURING METHOD

(71) Applicant: TDK Corporation, Tokyo (JP)

(72) Inventors: Kazutoshi Tsuyutani, Tokyo (JP); Yoshihiro Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 475 days.

(21) Appl. No.: 17/620,485

(22) PCT Filed: Jun. 5, 2020

(86) PCT No.: PCT/JP2020/022240
§ 371 (c)(1),
(2) Date: Dec. 17, 2021

(87) PCT Pub. No.: WO2020/255745
PCT Pub. Date: Dec. 24, 2020

(65) Prior Publication Data
US 2022/0267142 A1    Aug. 25, 2022

(30) Foreign Application Priority Data
Jun. 19, 2019  (JP) .................................. 2019-113959

(51) Int. Cl.
*H01L 21/48* (2006.01)
*B81B 7/00* (2006.01)
(Continued)

(52) U.S. Cl.
CPC ........ *B81B 7/0061* (2013.01); *B81C 1/00309* (2013.01); *G01D 11/245* (2013.01);
(Continued)

(58) Field of Classification Search
CPC ............... H01L 23/12; H01L 23/49828; H01L 23/49822; H01L 21/4857; H01L 21/4846; H04R 2201/003
(Continued)

(56) References Cited

U.S. PATENT DOCUMENTS 8,309,864 B2 * 11/2012 Kobayashi .......... H01L 23/3114
174/265
8,698,009 B2 * 4/2014 Noda ................... H05K 3/4602
174/262

(Continued)

FOREIGN PATENT DOCUMENTS

JP         2004265948 A  *  9/2004  ............. H01L 23/13
JP         2008-282902 A     11/2008
(Continued)

OTHER PUBLICATIONS

International Search Report issued in corresponding International Patent Application No. PCT/JP2020/022240, dated Sep. 1, 2020, with English translation.

*Primary Examiner* — Igwe U Anya
(74) *Attorney, Agent, or Firm* — Rimon P.C.

(57) ABSTRACT

A sensor package substrate has through holes V1 and V2 at a position overlapping a sensor chip mounting area. The through hole V1 has a minimum inner diameter at a depth position D1, and the through hole V2 has a minimum inner diameter at a depth position D2 different from the depth position D1. Thus, since the plurality of through holes are formed at a position overlapping the sensor chip mounting area, the diameter of each of the through holes can be reduced. This makes foreign matters unlikely to enter through the through holes, and a reduction in the strength of the substrate is suppressed. In addition, since the depth position D1 and depth position D2 are located at different depth levels, it is possible to sufficiently maintain the (Continued)

strength of a part of the substrate that is positioned between the through holes V1 and V2.

13 Claims, 12 Drawing Sheets

(51) Int. Cl.
    *B81C 1/00*         (2006.01)
    *G01D 11/24*       (2006.01)
    *H01L 23/498*     (2006.01)
    *H04R 1/04*         (2006.01)
    *H04R 19/04*       (2006.01)

(52) U.S. Cl.
    CPC ............... *B81B 2201/0257* (2013.01); *B81B 2201/0264* (2013.01); *B81B 2201/0278* (2013.01); *B81B 2207/012* (2013.01); *B81C 2203/0109* (2013.01); *H04R 1/04* (2013.01); *H04R 19/04* (2013.01); *H04R 2201/003* (2013.01)

(58) Field of Classification Search
    USPC ........................................................ 257/416
    See application file for complete search history.

(56) References Cited

U.S. PATENT DOCUMENTS

| | | | | |
|---|---|---|---|---|
| 9,185,799 | B2* | 11/2015 | Ishida | H05K 1/0306 |
| 9,252,096 | B2* | 2/2016 | Hondo | H01L 23/49827 |
| 10,420,206 | B2* | 9/2019 | Leitgeb | H05K 3/42 |
| 2002/0017710 | A1* | 2/2002 | Kurashima | H01L 24/81 |
| | | | | 257/E21.705 |
| 2003/0137056 | A1* | 7/2003 | Taniguchi | H05K 3/0044 |
| | | | | 257/E23.009 |
| 2008/0257591 | A1* | 10/2008 | Ikeda | H05K 3/427 |
| | | | | 29/830 |
| 2012/0043123 | A1* | 2/2012 | Takada | H01L 23/49822 |
| | | | | 174/262 |
| 2019/0297731 | A1* | 9/2019 | Hitsuoka | H05K 1/11 |

FOREIGN PATENT DOCUMENTS

| | | |
|---|---|---|
| JP | 2009-186378 A | 8/2009 |
| JP | 2010-187277 A | 8/2010 |
| JP | 2016-034030 A | 3/2016 |
| JP | 2018-159595 A | 10/2018 |

* cited by examiner

SENSOR PACKAGE SUBSTRATE, SENSOR MODULE HAVING THE SAME, AND SENSOR PACKAGE SUBSTRATE MANUFACTURING METHOD

CROSS REFERENCE TO RELATED APPLICATIONS

This application is the U.S. National Phase under 35 U.S.C. § 371 of International Application No. PCT/JP2020/022240, filed on Jun. 5, 2020, which claims the benefit of Japanese Application No. 2019-113959, filed on Jun. 19, 2019, the entire contents of each are hereby incorporated by reference.

TECHNICAL FIELD

The present invention relates to a sensor package substrate and a sensor module having the same and, more particularly, to a sensor package substrate for mounting thereon a sensor for detecting air vibration, air pressure, air temperature, or air composition and a sensor module having the same. The present invention also relates to a manufacturing method for such a sensor package substrate.

BACKGROUND ART

As a sensor module having a sensor chip such as a microphone, a sensor module described in Patent Document 1 is known. The sensor module described in Patent Document 1 includes a substrate having a through hole and a sensor chip mounted on the substrate so as to overlap the through hole, and the sensor chip detects vibration (sound) of air entering through the through hole.

CITATION LIST

Patent Document

[Patent Document 1] JP 2010-187277 A

SUMMARY OF THE INVENTION

Problem to be Solved by the Invention

However, in the sensor module described in Patent Document 1, a single large-diameter through hole is formed corresponding to one sensor chip, so that not only that foreign matters such as dirt and dust are likely to enter the inside of the substrate through the through hole, but also that the strength of the substrate tends to be insufficient.

An object of the present invention is therefore to provide a sensor package substrate having a through hole, capable of preventing foreign matters from entering the inside of the substrate through the through hole and suppressing a reduction in the strength of the substrate and a sensor module having such a sensor package substrate. Another object of the present invention is to provide a manufacturing method for such a sensor package substrate.

Means for Solving the Problem

A sensor package substrate according to the present invention includes: a sensor chip mounting area for mounting a sensor chip; and a plurality of through holes formed at a position overlapping the sensor chip mounting area in a plan view so as to penetrate the sensor package substrate from one surface to the other surface thereof. The plurality of through holes include first and second through holes. The first through hole has a minimum inner diameter at a first depth position, and the second through hole has a minimum inner diameter at a second depth position, the first and second depth positions being located at different depth levels.

Further, a sensor module according to the present invention includes the above sensor package substrate and a sensor chip mounted in the sensor chip mounting area.

According to the present invention, since the plurality of through holes are formed at a position overlapping the sensor chip mounting area, the diameter of each of the through holes can be reduced. This makes foreign matters unlikely to enter the inside of the substrate through the through holes, but on the other hand, the strength of the substrate may be reduced. However, the first depth position at which the diameter of the first through hole becomes minimum and the second depth position at which the diameter of the second through hole becomes minimum are located at different depth levels, so that it is possible to sufficiently maintain the strength of a part of the substrate that is positioned between the first and second through holes.

In the present invention, the first through hole may have a shape whose inner diameter increases from the first depth position toward one surface and the other surface of the substrate, and the second through hole may have a shape whose inner diameter increases from the second depth position toward one surface and the other surface of the substrate. This facilitates the circulation of air through the first and second through holes.

In the present invention, the diameters of the first and second through holes at one surface may differ from each other. With this configuration, when a blast method is used to form the first and second through holes, the first and second depth positions can be located at different depth levels.

In the present invention, the inner walls of the plurality of through holes may each be covered with a protective film. This can prevent detachment of filler or glass cloth contained in the substrate from the through hole. In this case, the protective film may be made of an insulating material or a metal material. In the former case, a short-circuit failure can be prevented even when a wiring pattern inside the substrate is exposed to the inner wall of the through hole. In the latter case, acoustic characteristics can be enhanced.

In the present invention, the sensor chip may be a sensor for detecting air vibration, air pressure, air temperature, or air composition. This allows air vibration, air pressure, air temperature or air composition to be detected through the plurality of through holes.

A manufacturing method for a sensor package substrate according to one aspect of the present invention includes: a step of preparing a substrate having a sensor chip mounting area for mounting a sensor chip and forming a metal mask having openings at a position overlapping the sensor chip mounting area in a plan view; and a step of forming first and second through holes penetrating the substrate from one surface to other surface thereof at a position overlapping the openings formed in the metal mask by performing one or both of laser processing and blast processing with the metal mask. The diameter of the metal mask opening corresponding to the first through hole differs in size from the diameter of the metal mask opening corresponding to the second through hole.

A manufacturing method for a sensor package substrate according to another aspect of the present invention includes: a step of preparing a substrate having a sensor chip mounting area for mounting a sensor chip and irradiating a position overlapping the sensor chip mounting area in a plan view with a laser beam to form a plurality of through holes penetrating the substrate from one surface to the other surface thereof. The plurality of through holes include first and second through holes. The intensity of the laser beam for forming the first through hole and the intensity of the laser beam for forming the second through hole differ from each other.

In either of the methods described above, it is possible to locate a first depth position at which the diameter of the first through hole becomes minimum and a second depth position at which the diameter of the second through hole becomes minimum at different depth levels.

The sensor package substrate manufacturing method according to the present invention may further include a step of covering the inner walls of the plurality of through holes with a protective film. This can prevent detachment of filler or glass cloth contained in the substrate from the through hole. In this case, the protective film may be formed by depositing an insulating material by a CVD method or depositing a metal material by a plating method. In the former case, a short-circuit failure can be prevented even when a wiring pattern inside the substrate is exposed to the inner wall of the through hole. In the latter case, acoustic characteristics can be enhanced.

Advantageous Effects of the Invention

As described above, according to the present invention, there can be provided a sensor package substrate capable of preventing foreign matters from entering the inside of the substrate through the through hole and suppressing a reduction in the strength of the substrate and a sensor module having such a sensor package substrate. Further, according to the present invention, there can be provided a manufacturing method for such a sensor package substrate.

MODE FOR CARRYING OUT THE INVENTION

Hereinafter, preferred embodiments of the present invention will be described in detail with reference to the accompanying drawings. Positional relationships such as upper, lower, left, and right will be based on those in the drawings unless otherwise noted. Further, the dimensional proportions in the drawings are not limited to those illustrated in the drawings. The following embodiments are provided for illustrative purposes only, and the invention is not limited to the following embodiments. Further, the present invention can be variously modified without departing from the gist of the invention.

Figure 1:
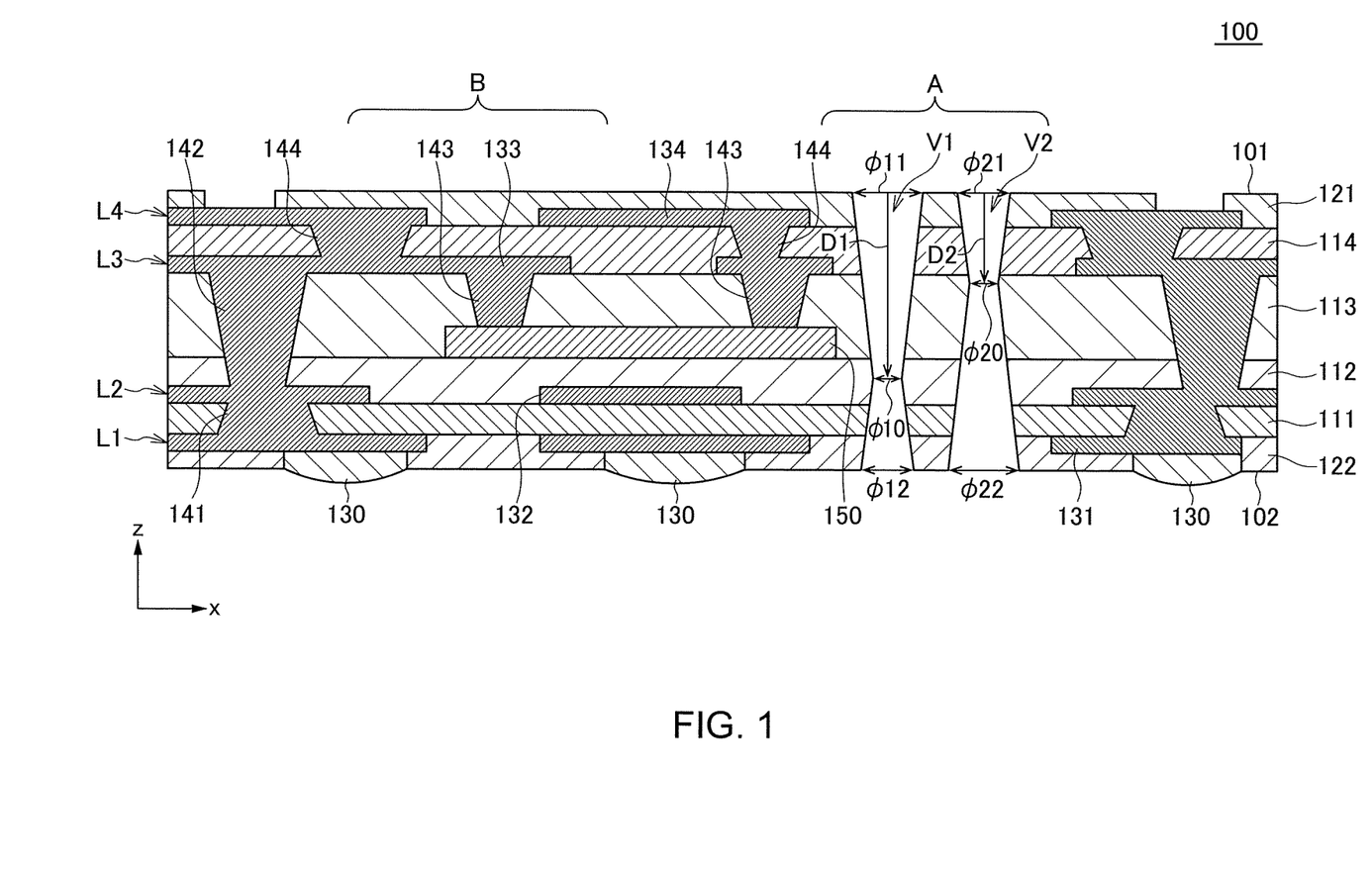
FIG. 1 is a schematic cross-sectional view for explaining the structure of a sensor package substrate 100 according to an embodiment of the present invention.

FIG. 1 is a schematic cross-sectional view for explaining the structure of a sensor package substrate 100 according to an embodiment of the present invention.

As illustrated in FIG. 1, the sensor package substrate 100 according to the present embodiment includes four insulating layers 111 to 114 and wiring layers L1 to L4 positioned on the surfaces of the insulating layers 111 to 114. Although not particularly limited, the insulating layer 111 positioned in the lowermost layer and the insulating layer 114 positioned in the uppermost layer may each be a core layer obtained by impregnating a core material such as glass fiber, with a resin material such as glass epoxy. On the other hand, the insulating layers 112 and 113 may each be made of a resin material not containing a core material such as glass cloth. In particular, the thermal expansion coefficient of the insulating layers 111 and 114 is preferably smaller than that of the insulating layers 112 and 113.

The insulating layer 114 positioned in the uppermost layer and the wiring layer L4 formed on the surface of the insulating layer 114 are partially covered by a solder resist 121. On the other hand, the insulating layer 111 positioned in the lowermost layer and the wiring layer L1 formed on the surface of the insulating layer 111 are partially covered by a solder resist 122. The solder resist 121 constitutes one surface 101 of the sensor package substrate 100, and the solder resist 122 constitutes the other surface 102 of the sensor package substrate 100.

The wiring layers L1 to L4 have wiring patterns 131 to 134, respectively. An external terminal 130 is formed at a part of the wiring pattern 131 that is not covered with the solder resist 122. The external terminal 130 serves as a connection terminal to a motherboard to be described later. A part of the wiring pattern 134 that is not covered with the solder resist 121 is used as a bonding pad. The wiring patterns 131 to 134 are mutually connected through hole conductors 141 to 144 penetrating the insulating layers 111 to 114.

In the present embodiment, sensor chip mounting areas A and B are defined on the surface 101 of the sensor package substrate 100. Further, through holes V1 and V2 penetrating the sensor package substrate 100 from the surface 101 to the surface 102 are formed at a position overlapping the sensor chip mounting area A in a plan view. The through holes V1 and V2 are not closed but opened to both the surfaces 101 and 102, allowing air to circulate through the through holes V1 and V2. Although only the two through holes V1 and V2 are illustrated in FIG. 1, three or more through holes may be formed at a position overlapping the sensor chip mounting area A. As described above, in the sensor package substrate 100 according to the present embodiment, not a single through hole having a large diameter, but a plurality of through holes each having smaller diameter are formed at a position overlapping the sensor chip mounting area A. This makes foreign matters unlikely to enter the inside of the substrate through the through holes. Further, in this case, when the depth positions at which the diameters of the through holes V1 and V2 become minimum are located at different depth levels, a reduction in the strength of the substrate is suppressed.

As illustrated in FIG. 1, the diameter of the through hole V1 at the surface 101 is $\phi 11$, and the diameter of the through hole V1 at the surface 102 is $\phi 12$. Further, the inner diameter of the through hole V1 becomes minimum at a predetermined depth position D1. The diameter of the through hole V1 at the depth position D1 is $\phi 10$. The depth position D1 is not the center position in the thickness direction of the substrate but is offset to the surface 102 side. The diameters $\phi 10$ to $\phi 12$ satisfies the following relation:

$$\phi 11 > \phi 12 > \phi 10.$$

The through hole V1 has a tapered shape whose inner diameter increases from the depth position D1 toward the surfaces 101 and 102.

Similarly, the diameter of the through hole V2 at the surface 101 is $\phi 21$, and the diameter of the through hole V2 at the surface 102 is $\phi 22$. Further, the inner diameter of the through hole V2 becomes minimum at a predetermined depth position D2. The diameter of the through hole V2 at the depth position D2 is $\phi 20$. The depth position D2 is not the center position in the thickness direction of the substrate but is offset to the surface 101 side. The diameters $\phi 20$ to $\phi 22$ satisfies the following relation:

$$\phi 22 > \phi 21 > \phi 20.$$

The through hole V2 has a tapered shape whose inner diameter increases from the depth position D2 toward the surfaces 101 and 102.

Although not particularly limited, in the present invention, $\phi 11 > \phi 21$ and $\phi 22 > \phi 12$ are both satisfied. Alternatively, $\phi 11 = \phi 22$ and $\phi 12 = \phi 21$ may be both satisfied.

As illustrated in FIG. 1, the depth position D1 at which the diameter of the through hole V1 becomes minimum and the depth position D2 at which the diameter of the through hole V2 becomes minimum are located at different depth levels. In the example of FIG. 1, D1>D2 is satisfied. Thus, despite the tapered shapes of the through holes V1 and V2, a change in the thickness (width in the x-direction) of a part of the sensor package substrate 100 that is positioned between the through holes V1 and V2 relative to the thickness direction (z-direction) is small.

That is, when the depth positions D1 and D2 are located at the same depth position, the thickness (width in the x-direction) of a part of the sensor package substrate 100 that is positioned between the through holes V1 and V2 significantly changes in the thickness direction (z-direction), so that the strength of the sensor package substrate 100 may become insufficient. In this case, the thickness in the vicinities of the surfaces 101 and 102 is significantly reduced, which may make it likely to cause cracks and breakage at these portions in the sensor package substrate 100. To prevent this, in the present embodiment, the depth positions D1 and D2 are located at different depth levels, thereby making it possible to sufficiently maintain the strength of the sensor package substrate 100.

The sensor package substrate 100 according to the present embodiment has a controller chip 150 which is embedded between the insulating layers 112 and 113. The controller chip 150 is an electronic component connected to sensor chips mounted in the sensor chip mounting areas A and B. As a matter of course, the controller chip 150 is disposed so as to avoid the through holes V1 and V2. However, the controller chip 150 and the sensor chip mounting areas A and B may partially overlap each other in a plan view. In the present invention, the electronic component such as the controller chip 150 is not particularly limited in type and may be a digital IC having a very high operating frequency (MEMS (Micro Electro Mechanical Systems), a CPU (Central Processing Unit), a DSP (Digital Signal Processor), a GPU (Graphics processing Unit), an ASIC (Application Specific Integrated Circuit), etc.), a memory-based IC (an F-Rom, an SDRAM, etc.), an active element such as an analog IC (an amplifier, an antenna switch, a high-frequency oscillation circuit, etc.) or a passive element (a varistor, a resistor, a capacitor, etc.).

In the present specification, the "sensor package substrate" does not indicate only an individual substrate (individual piece, individual product) that is a unit substrate incorporating therein or mounting thereon electronic components, but may refer to an aggregate substrate (work board, work sheet) that includes a plurality of the individual substrates.

Figure 2:
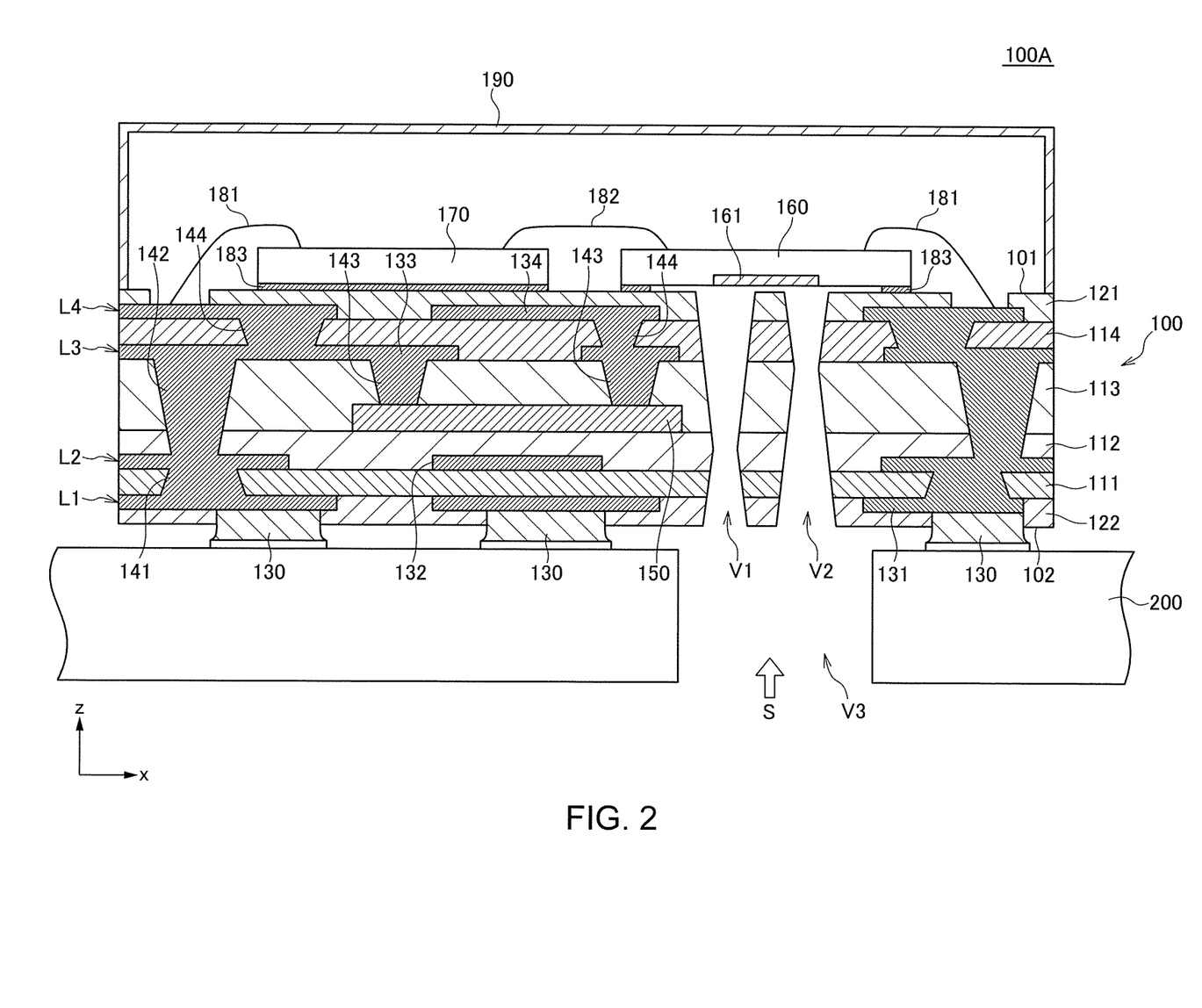
FIG. 2 is a schematic cross-sectional view for explaining the structure of a sensor module 100A according to a first embodiment using the sensor package substrate 100.

FIG. 2 is a schematic cross-sectional view for explaining the structure of a sensor module 100A according to a first embodiment using the sensor package substrate 100.

In the sensor module 100A illustrated in FIG. 2, a sensor chip 160 is mounted in the sensor chip mounting area A of the sensor package substrate 100, and a sensor chip 170 is mounted in the sensor chip mounting area B.

The sensor chip 160 is a sensor for detecting, e.g., air vibration, air pressure, air temperature or air composition, i.e., it is a microphone, a pressure sensor, a temperature sensor, a gas sensor, or the like. A detection part 161 of the sensor chip 160 is provided at a position facing the through holes V1 and V2 formed in the sensor package substrate 100. When the sensor chip 160 is, e.g., a microphone, the detection part 161 includes a vibration plate having a membrane structure. Although the position of the detection part 161 in the sensor chip 160 is not particularly limited, at least a part of the detection part 161 is exposed to the through holes V1 and V2. It follows that the detection part 161 of the sensor chip 160 is exposed to atmosphere through the through holes V1 and V2 and can thus detect air vibration, air pressure, air temperature or air composition.

The sensor chip 170 is also a sensor for detecting air vibration, air pressure, air temperature or air composition, i.e., it is a microphone, a pressure sensor, a temperature sensor, a gas sensor, or the like and may be a sensor that measures a physical quantity different from that measured by the sensor chip 160.

Output signals from the sensor chips 160 and 170 are connected to the wiring pattern 134 through a bonding wire 181. The sensor chips 160 and 170 may be directly connected to each other through a bonding wire 182. However, the method for connecting the sensor package substrate 100 and the sensor chips 160 and 170 is not limited to this, but flip-chip connection may be used. In the example illustrated in FIG. 2, the sensor chips 160 and 170 are attached to the surface 101 of the sensor package substrate 100 by a die attach film 183. Further, the sensor chips 160 and 170 overlap the controller chip 150 in a plan view.

The surface 101 of the sensor package substrate 100 is covered with a cap 190. The cap 190 plays a role of protecting the sensor chips 160 and 170 and enhancing detection characteristics of the sensor chips 160 and 170. In particular, when at least one of the sensor chips 160 and 170 is a microphone, the volume of a space 191 formed by the cap 190 has a great influence on acoustic characteristics.

As illustrated in FIG. 2, the sensor module 100A according to the present embodiment can be mounted on a motherboard 200. As illustrated in FIG. 2, a through hole V3 is formed in the motherboard 200, and the sensor module 100A is mounted on the motherboard 200 such that the through holes V1, V2 and the through hole V3 overlap each other in a plan view. It follows that the detection part 161 of the sensor chip 160 is exposed to atmosphere through the through holes V1 to V3. As a result, as dented by the arrow S, air vibration, air pressure, air temperature or air composition is transmitted to the sensor chip 160, allowing the physical quantity thereof to be detected. Further, in the present embodiment, electronic components and the like are not mounted on the back surface of the sensor module 100A, so that it is possible to make the gap between the sensor module 100A and the motherboard 200 very small. This can enhance the sensitivity of the sensor. The gap between the sensor module 100A and the motherboard 200 may be filled with an underfill.

The following describes a manufacturing method for the sensor package substrate 100 according to the present embodiment.

FIGS. 3 to 11 are process views for explaining the manufacturing method for the sensor package substrate 100 according to the present embodiment.

Figure 3:
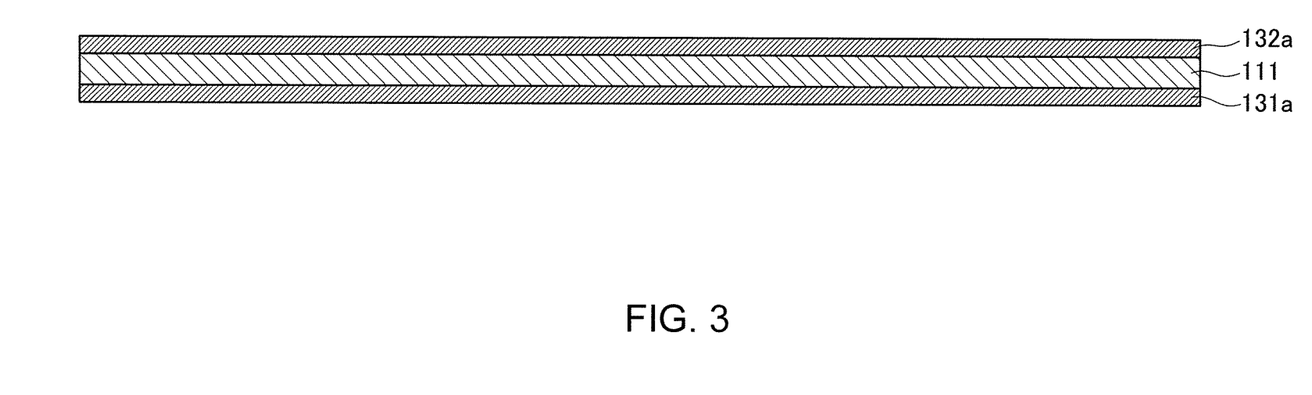
FIG. 3 is a process view for explaining the manufacturing method for the sensor package substrate 100 according to the present embodiment.

As illustrated in FIG. 3, a base material (a work board) formed by attaching metal films 131a and 132a such as Cu foils to both surfaces of the insulating layer 111 including a core material such as glass fiber, i.e., a double-sided CCL (Copper Clad Laminate) is prepared. In order to facilitate the formation of the through holes V1 and V2 in the subsequent process and to ensure an appropriate degree of rigidity for easy handling, the thickness of the core material included in the insulating layer 111 is preferably equal to or less than 40 μm. The material forming the metal films 131a and 132a is not particularly limited, and examples thereof include metal conductive materials such as Au, Ag, Ni, Pd, Sn, Cr, Al, W, Fe, Ti, and SUS in addition to above-mentioned Cu and, among them, Cu is preferable in terms of conductivity and cost. The same is applied to other metal films to be described later.

The resin material for forming the insulating layer 111 is not particularly limited as long as it can be formed into a sheet shape or a film shape, and examples thereof include: a single element selected from the group consisting of vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+activated ester curing resin, polyphenylene ether resin (polyphenylene oxide resin), curable polyolefin resin, benzo cyclobutene resin, polyimide resin, aromatic polyester resin, aromatic liquid crystal polyester resin, polyphenylene sulfide resin, polyether imide resin, polyacrylate resin, polyetheretherketone resin, fluororesin, epoxy resin, phenolic resin, and benzoxazine resin in addition to glass epoxy; a material obtained by adding, to one of the above-listed resins, silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like; and a material obtained by adding, to one of the above-listed resins, metal oxide powder containing at least one metal selected from the group consisting of magnesium, silicon, titanium, zinc, calcium, strontium, zirconium, tin, neodymium, samarium, aluminum, bismuth, lead, lanthanum, lithium and tantalum, and these examples may be selectively used as appropriate from the viewpoints of electrical characteristics, mechanical characteristics, water absorption properties, reflow durability, etc. Further, examples of the core material included in the insulating layer 111 include a material blended with, e.g., resin fiber such as glass fiber or aramid fiber.

Figure 4:
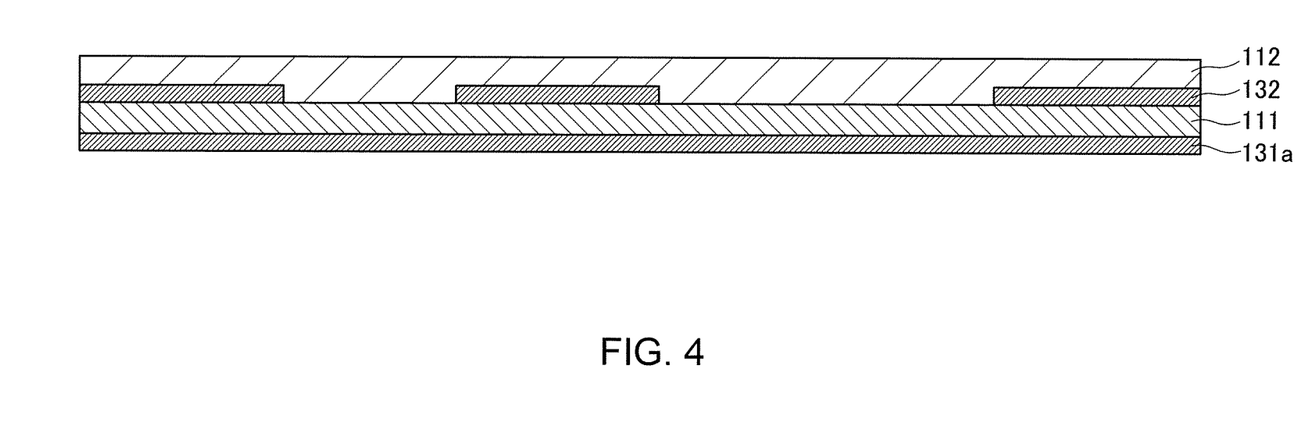
FIG. 4 is a process view for explaining the manufacturing method for the sensor package substrate 100 according to the present embodiment.

Next, as illustrated in FIG. 4, a known method such as photolithography is used to pattern the metal film 132a to form the wiring pattern 132. At this time, the metal film 132a is wholly removed at a position where the through holes V1 and V2 are ultimately to be formed. Further, for example, an uncured (B stage) resin sheet is laminated by vacuum pressure bonding or the like so as to embed therein the wiring pattern 132 to thereby form the insulating layer 112.

Figure 5:
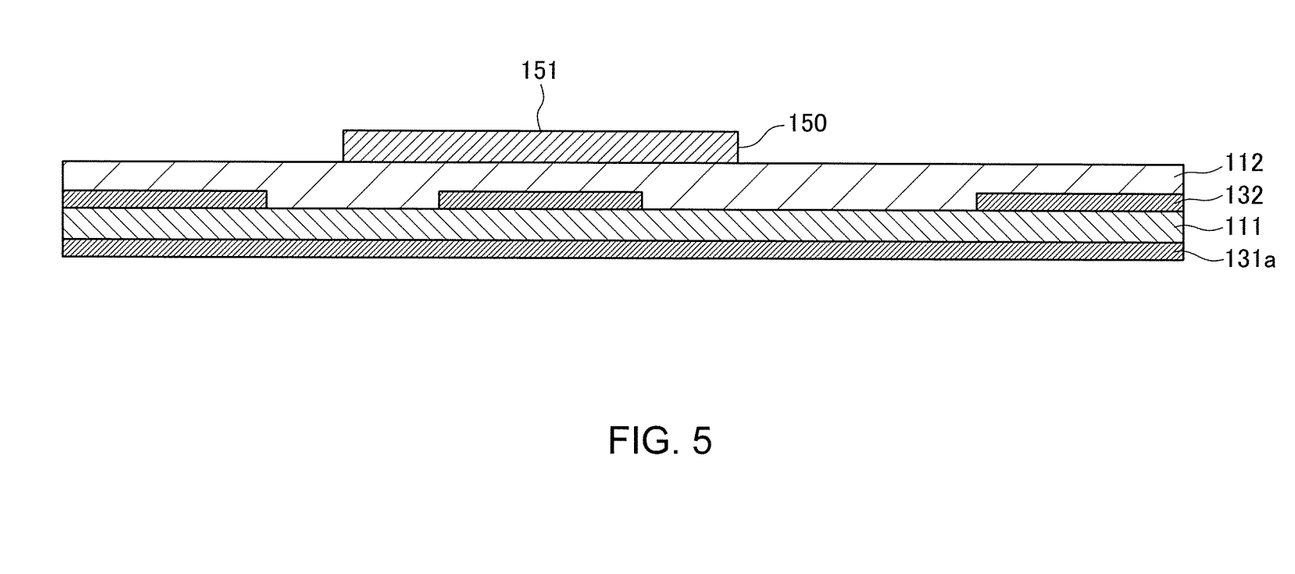
FIG. 5 is a process view for explaining the manufacturing method for the sensor package substrate 100 according to the present embodiment.

Then, as illustrated in FIG. 5, the controller chip 150 is placed on the insulating layer 112. The controller chip 150 is, e.g., a bare chip semiconductor IC and is face-up mounted such that a substantially rectangular plate-like main surface 151 faces upward. Not-shown many external terminals are provided on the main surface 151 of the controller chip 150. The controller chip 150 is polished at its back surface and thus has a thickness smaller than that of ordinary semiconductor ICs. Specifically, the thickness of the controller chip 150 is, e.g., equal to or less than 200 μm, preferably, about 50 μm to about 100 μm. In terms of cost, it is preferable to simultaneously apply machining to many controller chips 150 in a wafer state and, in this case, the back surface is first ground, and then the wafer is diced to obtain individual controller chips 150. Alternatively, when the wafer is diced into individual controller chips 150 or cut in half before thinning by means of polishing, the back surface can be polished while the main surface 151 of the controller chip 150 is covered with a thermosetting resin or the like. Thus, the processing order among the insulating film grinding, the electronic component back surface grinding and the dicing can be varied. As the grinding technique for the back surface of the controller chip 50, the back surface can be roughened by etching, plasma processing, laser processing, blast processing, polishing with a grinder, buffing, chemical treatment, or the like. With these methods, it is possible to not only achieve the thinning of the controller chip 150, but also to enhance adhesion to the insulating layer 112.

Figure 6:
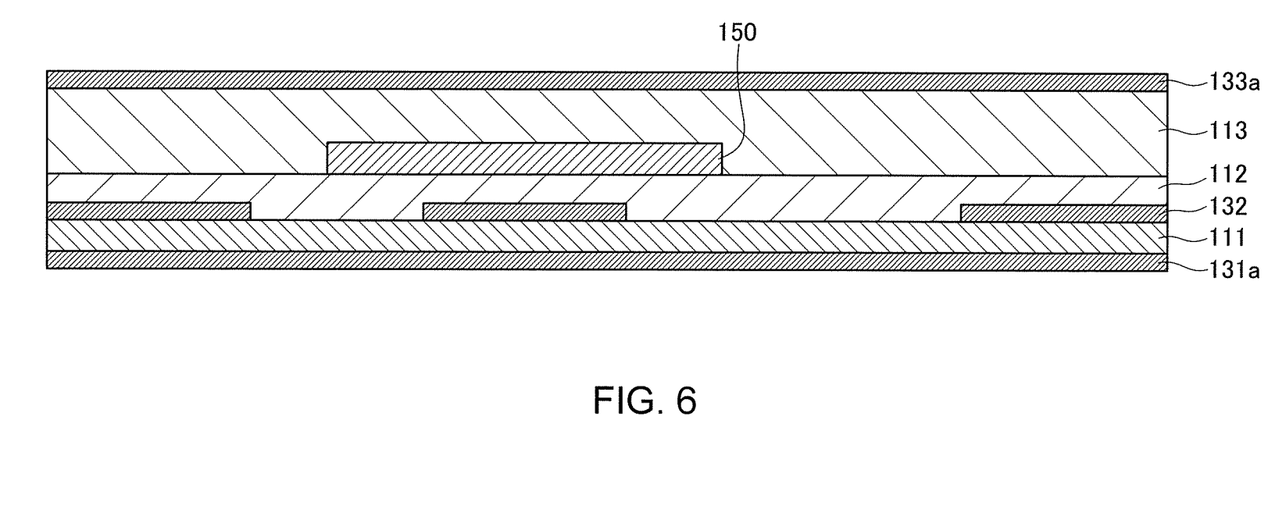
FIG. 6 is a process view for explaining the manufacturing method for the sensor package substrate 100 according to the present embodiment.

Then, as illustrated in FIG. 6, the insulating layer 113 and a metal film 133a are formed so as to cover the controller chip 150. Preferably, the insulating layer 113 is formed as follows: after application of an uncured or semi-cured thermosetting resin, the resin (when it is an uncured resin) is semi-cured by heating, and then the semi-cured resin and the metal film 133a are pressed together by a pressing means to obtain a cured insulating layer 113. The insulating layer 113 is preferably a resin sheet not containing fiber that prevents the controller chip 150 from being embedded. This enhances adhesion among the insulating layer 113, metal film 133a, insulating layer 112 and controller chip 150.

Figure 7:
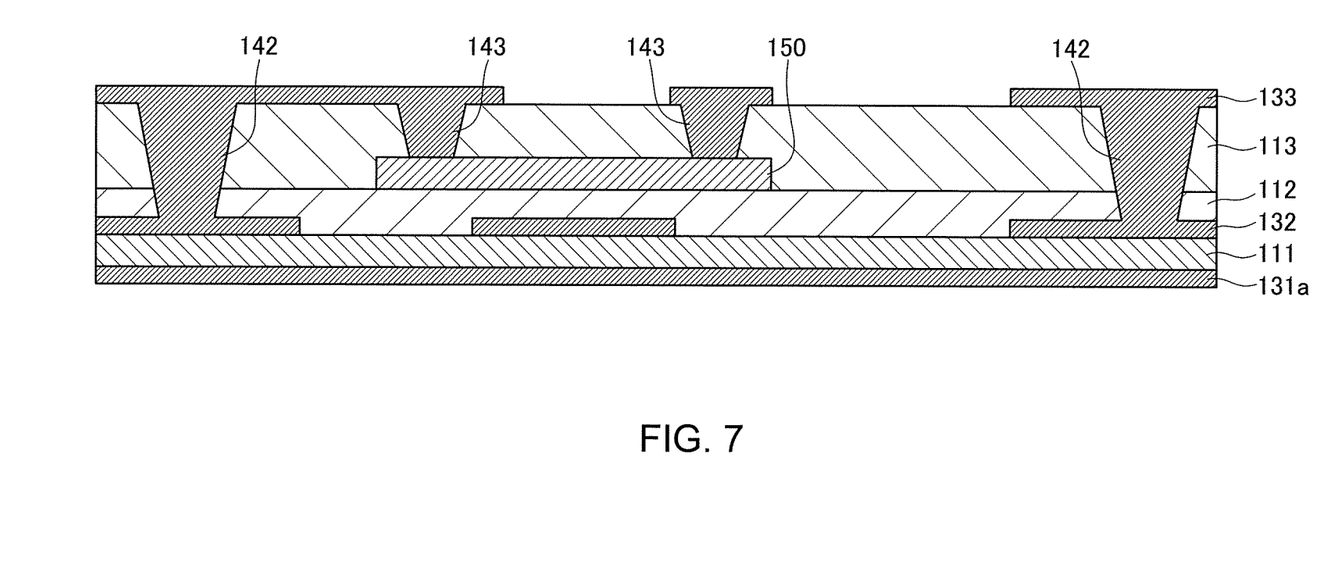
FIG. 7 is a process view for explaining the manufacturing method for the sensor package substrate 100 according to the present embodiment.

Then, as illustrated in FIG. 7, a part of the metal film 133a is etching-removed by using a known method such as photolithography, and then known laser or blast processing is applied to a predetermined location where the metal film 133a has been removed to form through holes in the insulating layers 112 and 113. After that, electroless plating and electrolytic plating are applied, followed by patterning of the metal film 133a by a known method, to thereby form the wiring pattern 133 and through hole conductors 142 and 143. At this time, at a position where the through holes V1 and V2 are ultimately to be formed, the metal film 133a is preferably removed. The through hole conductor 142 penetrates the insulating layers 113 and 112 to connect the wiring patterns 132 and 133, and the through hole conductor 143 penetrates the insulating layer 113 to connect the wiring pattern 133 and the controller chip 150.

Figure 8:
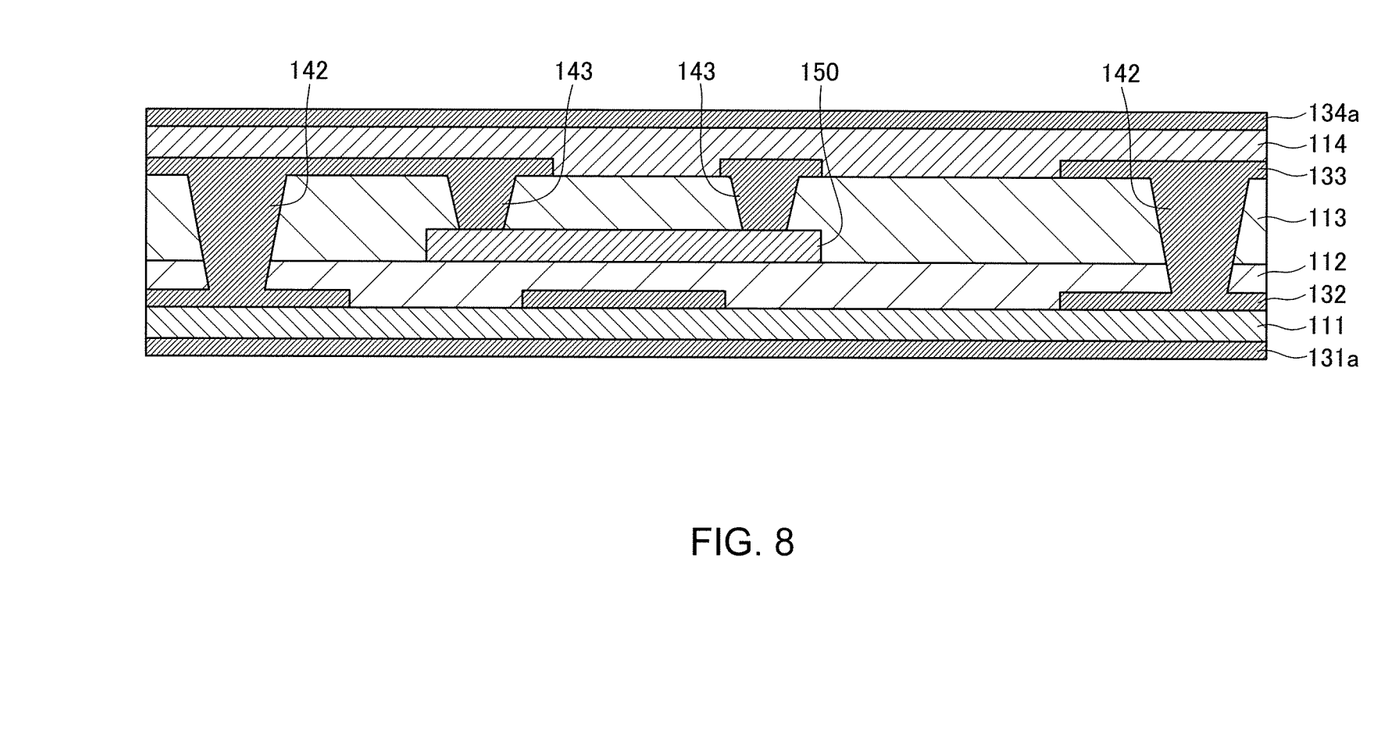
FIG. 8 is a process view for explaining the manufacturing method for the sensor package substrate 100 according to the present embodiment.

Then, as illustrated in FIG. 8, a sheet having the insulating layer 114 and a metal film 134a laminated thereon is hot-pressed under vacuum so as to embed therein the wiring pattern 133. The material and thickness of the insulating layer 114 may be the same as those of the insulating layer 111.

Figure 9:
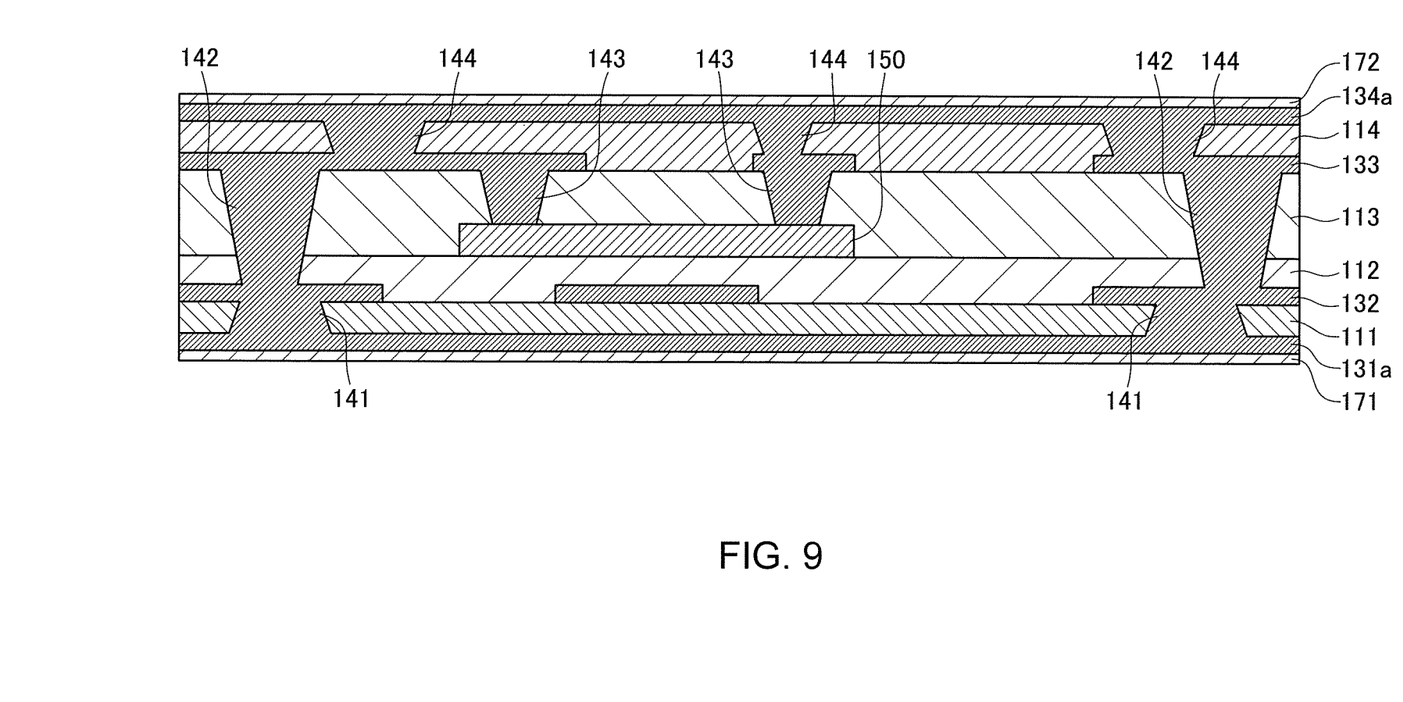
FIG. 9 is a process view for explaining the manufacturing method for the sensor package substrate 100 according to the present embodiment.

Then, as illustrated in FIG. 9, a part of the metal film 131a and a part of the metal film 134a are etching-removed by using a known method such as photolithography, and then known laser or blast processing is applied to predetermined locations where the metal films 131a and 134a have been removed to form through holes in the insulating layers 111 and 114. After that, electroless plating and electrolytic plating are applied to form through hole conductors 141 and 144. The through hole conductor 141 penetrates the insulating layer 111 to connect the wiring patterns 131 and 132, and the through hole conductor 144 penetrates the insulating layer 114 to connect the wiring patterns 133 and 134. After that, photosensitive dry films 171 and 172 are formed on the surfaces of the metal films 131a and 134a, respectively.

Figure 10:
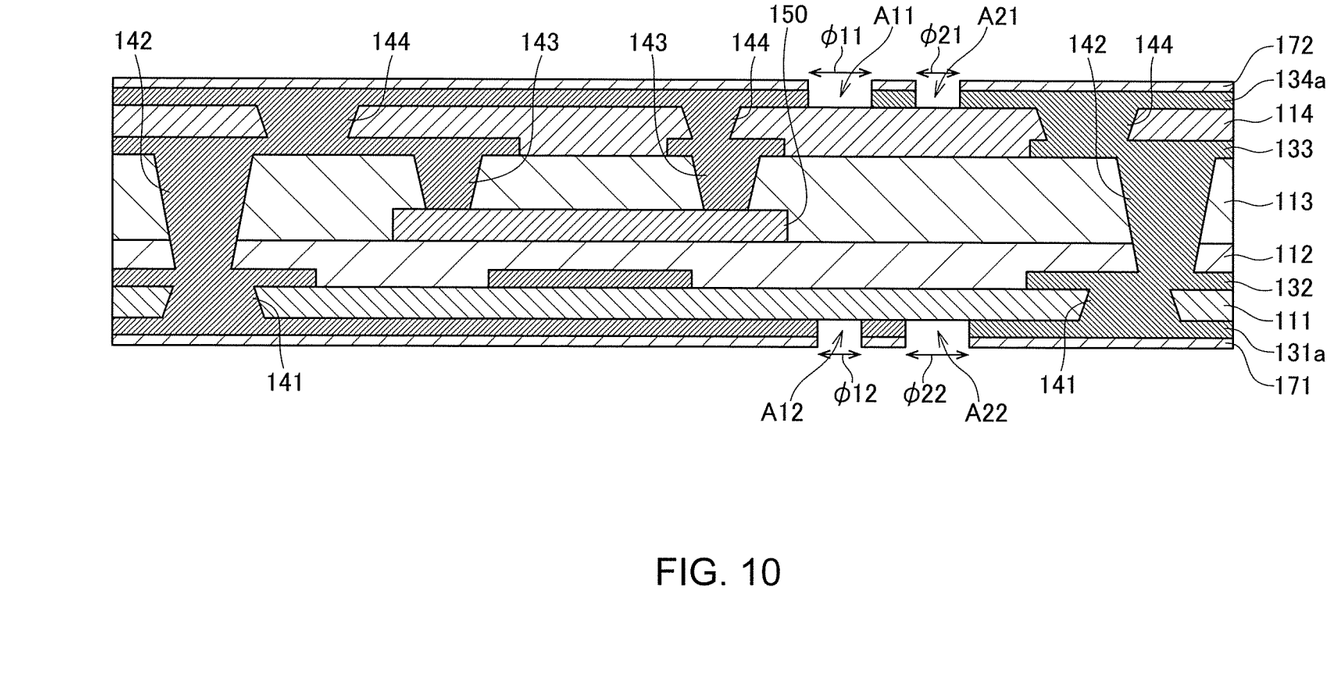
FIG. 10 is a process view for explaining the manufacturing method for the sensor package substrate 100 according to the present embodiment.

Then, as illustrated in FIG. 10, the dry films 171 and 172 are removed by photolithography at a planar position where the through holes V1 and V2 are to be formed, and the metal films 131a and 134a are removed at positions where they are exposed respectively through the dry films 171 and 172 to thereby form openings A11, A12, A21, and A22. The dry films 171 and metal film 131a in which the openings A12 and A22 are formed constitute a metal mask. Similarly, the dry films 172 and metal film 134a in which the openings A11 and A21 are formed constitute a metal mask.

At this time, for the dry film 172 positioned on the upper surface side, the diameter of the opening A11 corresponding to the through hole V1 is set to $\phi 11$, and the diameter of the opening A21 corresponding to the through hole V2 is set to $\phi 21$ ($<\phi 11$). For the dry film 171 positioned on the lower surface side, the diameter of the opening A12 corresponding to the through hole V1 is set to $\phi 12$, and the diameter of the opening A22 corresponding to the through hole V2 is set to $\phi 22$ ($>\phi 12$). Accordingly, the diameters of the openings formed in the metal film 134a are $\phi 11$ and $\phi 21$, and the diameters of the openings formed in the metal film 131a are $\phi 12$ and $\phi 22$. The opening diameters of the dry films 171 and 172 are increased by way of blast processing to be described later; therefore these opening diameters may be set slightly smaller than a designed value in the initial state, where the blast processing is yet to be performed, but show the design value ultimately after going through the blast processing.

Figure 11:
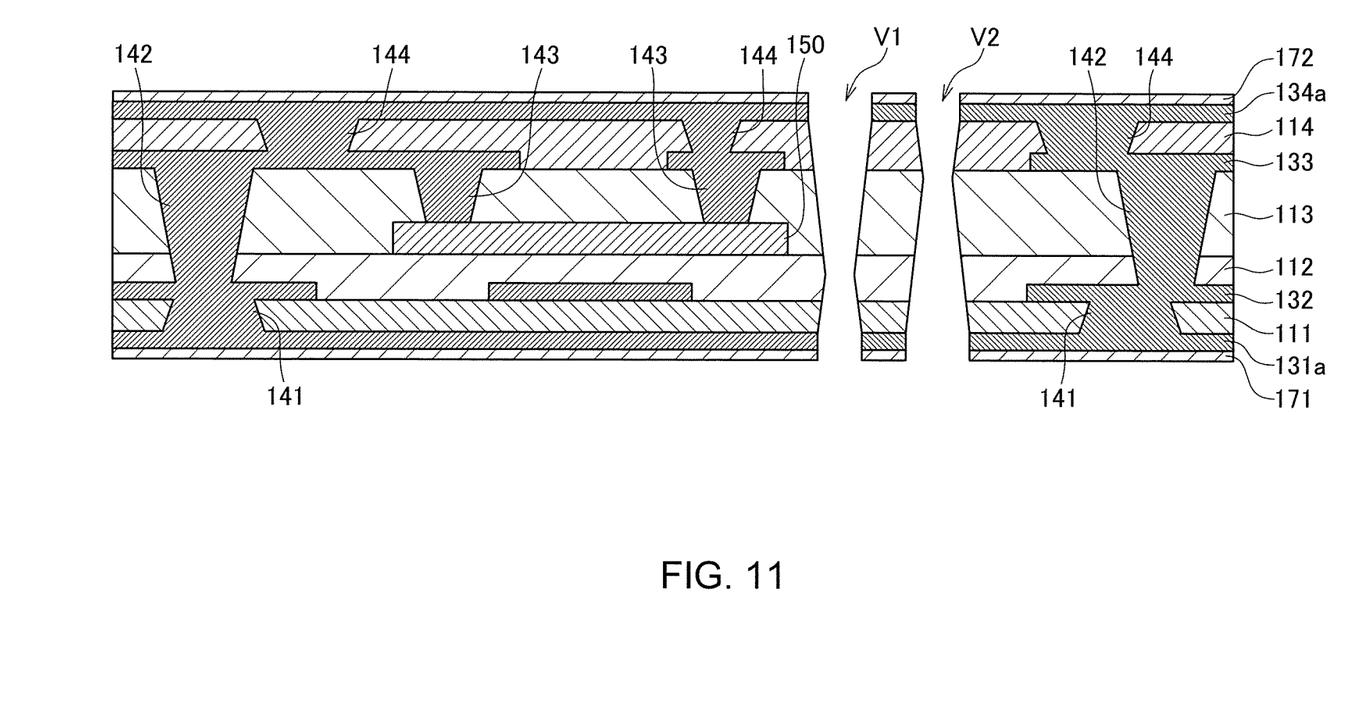
FIG. 11 is a process view for explaining the manufacturing method for the sensor package substrate 100 according to the present embodiment.

In this state, as illustrated in FIG. 11, one or both of laser processing and blast processing are applied to the front and back sides to form the through holes V1 and V2 penetrating the insulating layers 111 to 114. In the blast processing, the larger the diameter of the opening is, the higher the processing speed tends to be, and the larger the depth from the surfaces 101 and 102 is, the smaller the diameter to be formed tends to be. Accordingly, in the blast processing from the surface 101 side, the processing speed for a part corresponding to the opening A11 is slightly higher than that for a part corresponding to the opening A21. Similarly, in the blast processing from the surface 102 side, the processing speed for a part corresponding to the opening A22 is slightly higher than that for a part corresponding to the opening A12. As a result, the depth position D1 at which the inner diameter of the through hole V1 becomes minimum and the depth position D2 at which the inner diameter of the through hole V2 becomes minimum are located at different depth levels. The through holes V1 and V2 may be formed after removal of the dry films.

Then, the dry films 171 and 172 are removed, and then the metal films 131a and 134a are patterned by a known method such as photolithography to thereby form the wiring patterns 131 and 134. Then, as illustrated in FIG. 1, the solder resists 121 and 122 are formed on the surfaces of the insulating layers 114 and 111, respectively, and surface treatment for component mounting is applied at positions where the wiring patterns 134 and 131 are exposed respectively through the solder resists 121 and 122. The surface treatment may be Cu—OSP, Ni/Au plating, ENEPIG, or solder leveler treatment, but not limited thereto as long as it aims to prevent oxidation of the wiring pattern and to improve quality in component mounting in the subsequent process.

Thus, the sensor package substrate 100 according to the present embodiment is completed.

As described above, in the present embodiment, blast processing is performed in a state where the diameters of the openings A11 and A12 formed in the dry film 171 are made different in size from each other and where the diameters of the openings A12 and A22 formed in the dry film 172 are made different in size from each other, so that it is possible to locate the depth position D1 at which the inner diameter of the through hole V1 becomes minimum and the depth position D2 at which the inner diameter of the through hole V2 becomes minimum at different depth levels.

However, in the present invention, the openings for forming the through holes V1 and V2 need not necessarily be set in the above-described way. When the through holes V1 and V2 are formed by laser processing, the intensity of the laser beam to be irradiated onto the opening A11 may be made higher than that of the laser beam to be irradiated onto the opening A21, and the intensity of the laser beam to be irradiated onto the opening A22 may be made higher than that of the laser beam to be irradiated onto the opening A12. That is, the processing depth changes according to a difference in the intensity of the laser beam, allowing the depth positions D1 and D2 to be located at different depth levels.

Figure 12:
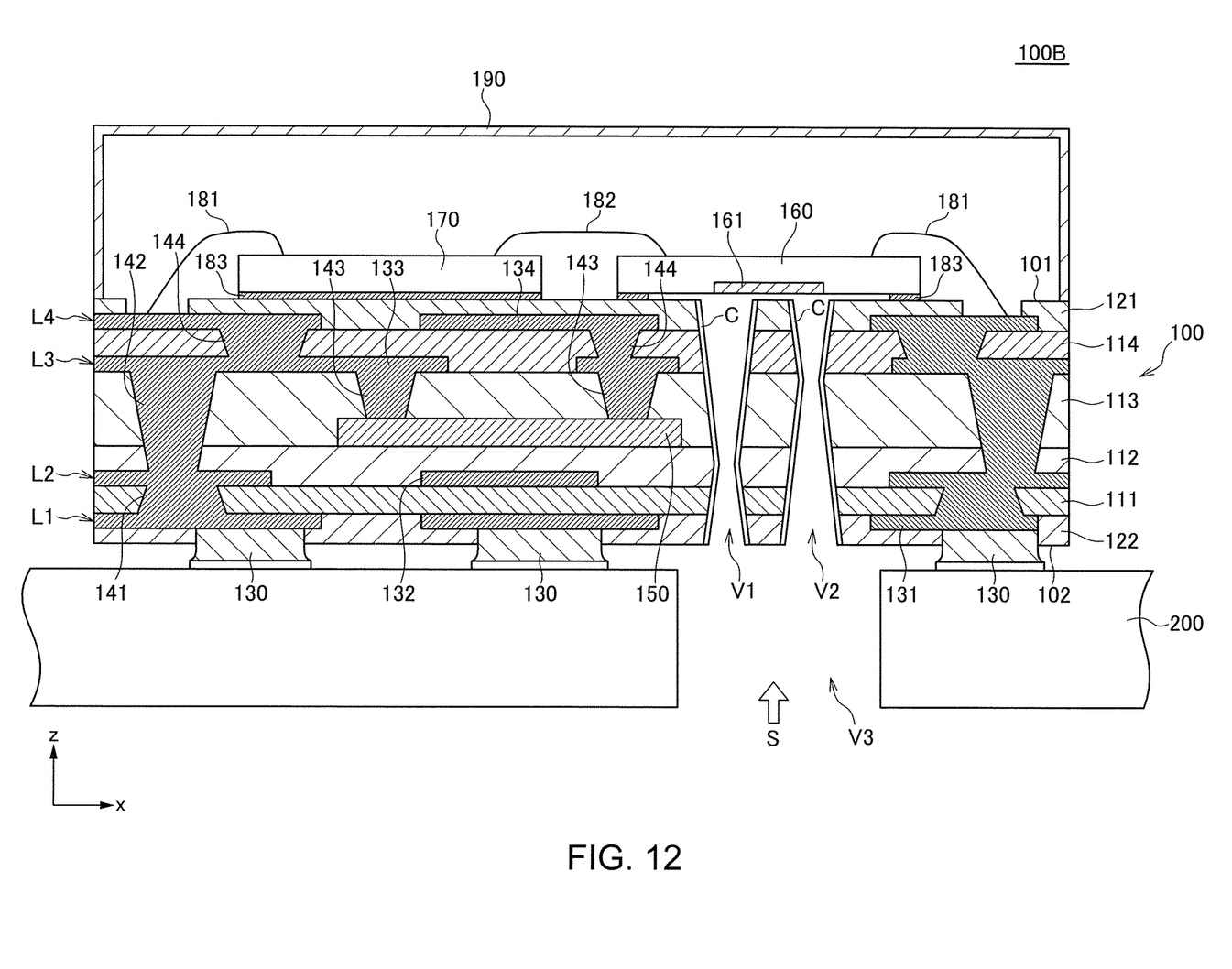
FIG. 12 is a schematic cross-sectional view for explaining the structure of a sensor module 100B according to a second embodiment.

FIG. 12 is a schematic cross-sectional view for explaining the structure of a sensor module 100B according to a second embodiment.

The sensor module 100B according to the second embodiment differs from the sensor module 100A according to the first embodiment in that the inner walls of the through holes V1 and V2 are covered with a protective film C. The protective film C may be made of an inorganic insulating material such as SiN, an organic insulating material such as polyimide, or a metal material. When the inner walls of the through holes V1 and V2 are thus covered with the protective film C, detachment of filler, glass cloth, or the like exposed to the inner walls of the through holes V1 and V2 can be prevented. In particular, when an insulating material is used as the material of the protective film C, a short-circuit failure can be prevented even when a part of the wiring pattern is exposed to the inner walls of the through holes V1 and V2. On the other hand, when a metal material is used as the material of the protective film C, the acoustic characteristics of the through holes V1 and V2 can be enhanced.

The protective film C may be formed by a CVD method when an inorganic insulating material such as SiN is selected and may be formed by a plating method when a metal material is selected.

It is apparent that the present invention is not limited to the above embodiments, but may be modified and changed without departing from the scope and spirit of the invention.

REFERENCE SIGNS LIST 100 sensor package substrate
100A, 100B sensor module
101 one surface
102 other surface
111-114 insulating layer
121, 122 solder resist
130 external terminal
131-134 wiring pattern
131a-134a metal film
141-144 through hole conductor
150 controller chip
151 main surface
160, 170 sensor chip
161 detection part
171, 172 dry film
181, 182 bonding wire
183 die attach film
190 cap
191 space
200 motherboard
A, B sensor chip mounting area
A11, A12, A21, A22 opening
C protective film
D1, D2 depth position
L1-L4 wiring layer
V1-V3 through hole

What is claimed is:

1. A sensor package substrate comprising:
a sensor chip mounting area for mounting a sensor chip; and
a plurality of through holes formed at a position overlapping the sensor chip mounting area in a plan view so as to penetrate the sensor package substrate from one surface to other surface thereof,
wherein the plurality of through holes include first and second through holes,
wherein the first through hole has a minimum inner diameter at a first depth position,
wherein the second through hole has a minimum inner diameter at a second depth position, and
wherein the first and second depth positions are located at different depth levels, and
wherein diameters of the first and second through holes at the one surface differ from each.

2. The sensor package substrate as claimed in claim 1, wherein the first through hole has a shape whose inner diameter increases from the first depth position toward one surface and the other surface of the substrate, and wherein the second through hole has a shape whose inner diameter increases from the second depth position toward one surface and the other surface of the substrate.

3. The sensor package substrate as claimed in claim 1, wherein each of inner walls of the plurality of through holes is covered with a protective film.

4. The sensor package substrate as claimed in claim 3, wherein the protective film is made of an insulating material.

5. The sensor package substrate as claimed in claim 3, wherein the protective film is made of a metal material.

6. A sensor module comprising:
the sensor package substrate as claimed in claim 1; and
a sensor chip mounted in the sensor chip mounting area.

7. The sensor module as claimed in claim 6, wherein the sensor chip is a sensor for detecting air vibration, air pressure, air temperature, or air composition.

8. A method for manufacturing a sensor package substrate, the method comprising:
preparing a substrate having a sensor chip mounting area for mounting a sensor chip and forming a metal mask having openings at a position overlapping the sensor chip mounting area in a plan view; and
forming first and second through holes penetrating the substrate from one surface to other surface thereof at a position overlapping the openings of the metal mask by performing one or both of laser processing and blast processing with the metal mask,
wherein a diameter of the metal mask opening corresponding to the first through hole differs in size from a diameter of the metal mask opening corresponding to the second through hole.

9. The method for manufacturing a sensor package substrate as claimed in claim 8, further comprising covering inner walls of the plurality of through holes with a protective film.

10. The method for manufacturing a sensor package substrate as claimed in claim 9, wherein the protective film is formed by depositing an insulating material by a CVD method.

11. The method for manufacturing a sensor package substrate as claimed in claim 9, wherein the protective film is formed by depositing a metal material by a plating method.

12. A method for manufacturing a sensor package substrate, the method comprising preparing a substrate having a sensor chip mounting area for mounting a sensor chip and irradiating a position overlapping the sensor chip mounting area in a plan view with a laser beam to form a plurality of through holes penetrating the substrate from one surface to other surface thereof,
wherein the plurality of through holes include first and second through holes, and
wherein an intensity of the laser beam for forming the first through hole and an intensity of the laser beam for forming the second through hole differ from each other.

13. The method for manufacturing a sensor package substrate as claimed in claim 12, further comprising covering inner walls of the plurality of through holes with a protective film.

* * * * *